(12) United States Patent
Gambino et al.

(10) Patent No.: US 7,704,876 B2
(45) Date of Patent: Apr. 27, 2010

(54) DUAL DAMASCENE INTERCONNECT STRUCTURES HAVING DIFFERENT MATERIALS FOR LINE AND VIA CONDUCTORS

(75) Inventors: Jeffrey Gambino, Westford, VT (US); Edward Cooney, III, Jericho, VT (US); Anthony Stamper, Willston, VT (US); William Thomas Motsiff, Essex Junction, VT (US); Michael Lane, Cortland Manor, NY (US); Andrew Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 11/847,657

(22) Filed: Aug. 30, 2007

(65) Prior Publication Data

US 2008/0026566 A1    Jan. 31, 2008

Related U.S. Application Data

(62) Division of application No. 11/174,985, filed on Jul. 5, 2005, now Pat. No. 7,300,867, which is a division of application No. 10/604,026, filed on Jun. 23, 2003, now Pat. No. 6,958,540.

(51) Int. Cl.
*H01L 21/4763* (2006.01)
(52) U.S. Cl. .................. 438/638; 438/625; 438/629; 257/E21.579
(58) Field of Classification Search ......... 438/625–629, 438/637–640; 257/E21.579
See application file for complete search history.

(56) References Cited

U.S. PATENT DOCUMENTS

| | | | |
|---|---|---|---|
| 5,795,823 A | 8/1998 | Avanzino et al. | |
| 5,821,168 A | 10/1998 | Jain | |
| 5,897,369 A | 4/1999 | Jun | |
| 6,028,362 A | 2/2000 | Omura | |
| 6,283,920 B1 | 9/2001 | Eberle et al. | |
| 6,383,821 B1 | 5/2002 | Young et al. | |
| 2002/0086519 A1* | 7/2002 | Houston et al. | 438/622 |
| 2002/0096768 A1 | 7/2002 | Joshi | |
| 2003/0003711 A1* | 1/2003 | Modak | 438/629 |
| 2004/0108217 A1 | 6/2004 | Dubin | |
| 2004/0175921 A1* | 9/2004 | Cowley et al. | 438/622 |

FOREIGN PATENT DOCUMENTS

| | | |
|---|---|---|
| TW | 461036 | 10/2001 |
| TW | 483105 | 4/2002 |
| TW | 522479 | 3/2003 |

OTHER PUBLICATIONS

Communication pursuant to Article 94(3) EPC, Application No. 04 741 743.1-2203, Feb. 18, 2010.

* cited by examiner

*Primary Examiner*—Thanhha Pham
(74) *Attorney, Agent, or Firm*—Lisa U. Jaklitsch; Katherine S. Brown

(57) ABSTRACT

Methods are disclosed for forming dual damascene back-end-of-line (BEOL) interconnect structures using materials for the vias or studs which are different from those used for the line conductors, or using materials for the via liner which are different from those used for the trench liner, or having a via liner thickness different from that of the trench liner. Preferably, a thick refractory metal is used in the vias for improved mechanical strength while using only a thin refractory metal in the trenches to provide low resistance.

13 Claims, 9 Drawing Sheets

DUAL DAMASCENE INTERCONNECT STRUCTURES HAVING DIFFERENT MATERIALS FOR LINE AND VIA CONDUCTORS

CROSS REFERENCE TO RELATED PATENT APPLICATION

This application is a divisional of U.S. patent application Ser. No. 11/174,985, filed Jul. 5, 2005 now U.S. Pat. No. 7,300,867, and entitled "Dual Damascene Interconnect Structures Having Different Materials for Line and Via Conductors", which in turn is a divisional of U.S. patent application Ser. No. 10/604,026 filed Jun. 23, 2003, that is now U.S. Pat. No. 6,958,540 issued on Oct. 25, 2005. The contents of above applications are incorporated herein by reference in their entirety.

FIELD OF THE INVENTION

This invention relates to the formation of back-end-of-line (BEOL) interconnect structures in integrated circuits. More particularly, this invention relates to new methods of forming dual damascene interconnect structures using materials for the vias or studs which are different from those used for the line conductors.

BACKGROUND OF THE INVENTION

The semiconductor industry roadmap calls for lowering the dielectric constant on the insulation surrounding multi-level on-chip interconnects. The dielectric constant must be lowered so as to reduce the parasitic capacitive load to the integrated circuits, as well as to reduce the capacitive coupling between neighboring interconnects.

Reducing dielectric constant often comes with a concomitant reduction in insulator mechanical properties such as modulus, hardness, thermal conductivity and fracture toughness. Significant stresses can develop in the structure due to thermal expansion mismatches with the substrate and the metal interconnects. These stresses can cause fatigue of copper vias or studs during thermal cycling, resulting in yield or reliability problems. A method is therefore needed to improve the strength of vias that are fabricated in low-k materials.

The strength of vias may be improved using a refractory metal instead of copper for the via, or by increasing the thickness of the refractory metal liner surrounding the via as compared to the line conductor. Heretofore, formation of interconnect structures having different materials or different liner thicknesses for the vias and lines could be achieved only by using a series of single damascene fabrication steps. Specifically, a via-level dielectric layer is first deposited, then a via opening is formed in the dielectric material, and then the via is filled with a first conductive material. Excess conductive material is removed by, e.g., chemical mechanical polishing (CMP) to make the top surface of the via coplanar with the top surface of the via-level dielectric. The line-level dielectric is next deposited, a trench opening is formed in the line-level dielectric overlying the via, and the trench is filled with a second conductive material. Again, excess conductive material must be removed by, e.g., CMP to make the top surface of the line conductor coplanar with the top surface of the line-level dielectric.

This series of single damascene steps is time-consuming and expensive. Moreover, two separate layers of dielectric (via-level and line-level) exhibit inferior electrical characteristics as compared to a single layer of dielectric material such as that found in a typical dual damascene structure.

Thus, there is a need in the art for a method of forming a dual damascene interconnect structure having a single layer of dielectric material for the via and line levels, but different materials or different liner thicknesses for the vias and lines.

SUMMARY OF THE INVENTION

It is therefore an object of this invention to provide a method for improving the strength of vias that are fabricated in low-k dielectric materials. This and other objects are accomplished by use of the methods of the present invention. In one aspect, an interconnect structure formed on a substrate is disclosed. The structure comprises: a first layer of a first dielectric material having at least one first conductor embedded therein, the first conductor having a top surface coplanar with a top surface of the layer of dielectric material; and a second layer of a second dielectric material overlying the first layer of dielectric material and having at least one second conductor embedded therein. The second conductor comprises at least one first portion and at least one second portion, the second portion being formed of a material different from the first portion, wherein the first portion is in electrical contact with the first conductor, the second portion is overlying and in electrical contact with the first portion, the second portion has a lateral extent greater than that of the first portion, and the second portion has a top surface coplanar with a top surface of the second layer of dielectric material. Optionally, the interconnect structure further comprises: a first conductive liner disposed between the first portion and the second dielectric material and between the first portion and the first conductor; and a second conductive liner disposed between the second portion and the second dielectric material and between the second portion and the first portion, the second liner being formed of a material different from the first liner.

In another aspect, the interconnect structure comprises: a first layer of a first dielectric material having at least one first conductor embedded therein, the first conductor having a top surface coplanar with a top surface of the layer of dielectric material; a second layer of a second dielectric material overlying the first layer of dielectric material and having at least one second conductor embedded therein; a first conductive liner disposed between the first portion and the second dielectric material and between the first portion and the first conductor; and a second liner disposed between the second portion and the second dielectric material, the second liner having a thickness less than the thickness of the first liner. The second conductor comprises at least one first portion and at least one second portion, wherein the first portion is in electrical contact with the first conductor, the second portion is overlying and in electrical contact with the first portion, the second portion has a lateral extent greater than that of the first portion, and the second portion has a top surface coplanar with a top surface of the second layer of dielectric material. Optionally, the interconnect structure further comprises: a conductive liner disposed between the second conductor and the second dielectric material and between the second conductor and the first conductor.

Methods of forming the interconnect structures of this invention are also disclosed. Specifically, methods for forming an interconnect structure on a substrate are disclosed, the substrate comprising a first layer of a first dielectric material having at least one first conductor embedded therein, the first conductor having a top surface coplanar with a top surface of the layer of dielectric material. In one aspect, the method comprises the steps of: depositing a second layer of a second dielectric material on the first layer of dielectric material; forming at least one first opening in the second layer of dielectric material, the first opening partially exposing the first conductor; filling the first opening with a first conductive material; removing a top portion of the first conductive material; forming at least one second opening in the second layer of dielectric material, the second opening overlying the first conductive material, and the second opening having a lateral extent greater than that of the first opening; and filling the second opening with a second conductive material, wherein the second conductive material is different from the first conductive material, and the second conductive material has a top surface which is made coplanar with the top surface of the second layer of dielectric material.

In a second aspect, the method comprises the steps of: depositing a second layer of a second dielectric material on the first layer of dielectric material; forming at least one first opening in the second layer of dielectric material, the first opening partially exposing the first conductor; depositing a first conductive liner on the bottom and sidewalls of the first opening; filling the first opening with a sacrificial material; forming at least one second opening in the second layer of dielectric material, the second opening overlying the first opening, and the second opening having a lateral extent greater than that of the first opening; removing the sacrificial material; depositing a second conductive liner on the bottom and sidewalls of the second opening and on the first liner; and filling the second opening with a conductive material, thereby forming a second conductor, wherein the second conductor has a top surface which is made coplanar with the top surface of the second layer of dielectric material.

In a third aspect, the method comprises the steps of: depositing a second layer of a second dielectric material on the first layer of dielectric material; forming at least one first opening in the second layer of dielectric material, the first opening extending partially through the second layer of dielectric material but not exposing the first conductor; forming at least one second opening in the second layer of dielectric material and extending the first opening through the remainder of the dielectric material, thereby exposing the first conductor, the second opening overlying the first opening and the second opening having a lateral extent greater than that of the first opening; depositing a first conductive liner on the bottom and sidewalls of the first and second openings; filling the first and second openings with a first conductive material; removing the first conductive material and the first liner from the second opening; depositing a second conductive liner on the bottom and sidewalls of the second opening; filling the second opening with a second conductive material, wherein the second conductive material is different from the first conductive material, and the second conductive material has a top surface which is made coplanar with the top surface of the second layer of dielectric material.

In a fourth aspect, the method comprises the steps of: depositing a second layer of a second dielectric material on the first layer of dielectric material; forming at least one first opening in the second layer of dielectric material, the first opening extending partially through the second layer of dielectric material but not exposing the first conductor; forming at least one second opening in the second layer of dielectric material and extending the first opening through the remainder of the dielectric material, thereby exposing the first conductor, the second opening overlying the first opening and the second opening having a lateral extent greater than that of the first opening; depositing a conductive liner on the bottom and sidewalls of the first and second openings; filling the first and second openings with a first conductive material; removing the first conductive material from the second opening; and filling the second opening with a second conductive material, wherein the second conductive material is different from the first conductive material, and the second conductive material has a top surface which is made coplanar with the top surface of the second layer of dielectric material.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION OF THE INVENTION

The invention will now be described by reference to the accompanying figures. In the figures, various aspects of the structures have been shown and schematically represented in a simplified manner to more clearly describe and illustrate the invention. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

In the interconnect structure of this invention, the vias are made stronger by using a different material for the via conductor, or a different material for the via liner, or a thicker via liner, or a combination of these characteristics. In a preferred embodiment, refractory metals are used in the vias while copper is used in the trenches. Refractory metal is mechanically stronger than copper, and therefore can withstand the stresses that are often present during thermal cycling.

Figure 1:
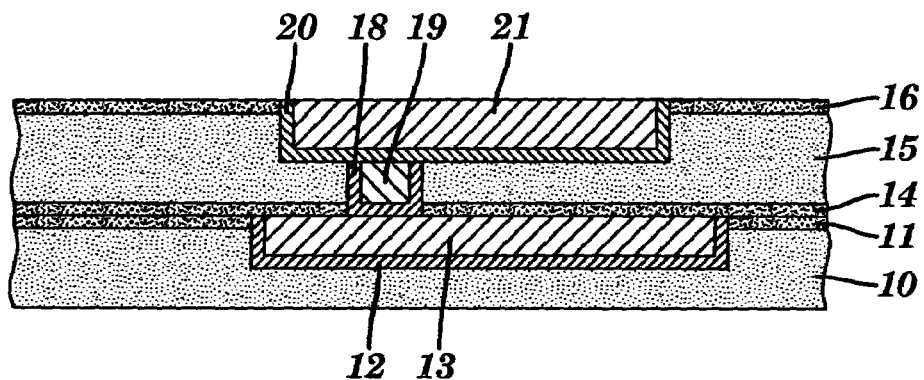
FIG. 1 illustrates an interconnect structure according to a first embodiment of the invention, in which the via is formed of a material different from that of the line conductor, and the via and line conductors are each fully surrounded on the bottom and sidewalls by separate liners.

A first embodiment of the invention is shown in FIG. 1, which includes a first dielectric layer 10. At least one first conductor 13 is embedded in the first dielectric layer 10 and has a top surface coplanar with the top surface of layer 10. Optionally, a hardmask layer 11 may be deposited on dielectric layer 10, in which case the conductor 13 has a top surface coplanar with the top surface of hardmask layer 11. A conductive liner 12 is also optionally disposed between conductor 13 and dielectric layer 10.

A second dielectric layer 15 overlies first dielectric layer 10. Optionally, a cap layer 14 separates second dielectric layer 15 from first dielectric layer 10 and first conductor 13. Second dielectric layer 15 has at least one second conductor embedded therein. The second conductor comprises at least one first portion 19, the via or stud, and at least one second portion 21, the line conductor. The first portion 19 overlies and is in electrical contact with the first conductor 13. The second portion 21 overlies and has a lateral extent greater than that of the first portion 19, and the second portion 21 has a top surface coplanar with the top surface of the second dielectric layer 15. Optionally, a hardmask layer 16 may be deposited on second dielectric layer 15, in which case the second portion 21 has a top surface coplanar with the top surface of hardmask layer 16. A liner 18 optionally surrounds a bottom and sidewalls of first portion 19, and a liner 20 optionally surrounds a bottom and sidewalls of second portion 21.

Preferably, tungsten or some other refractory metal is used for the first portion 19 of the second conductor, i.e. for the via or stud. Refractory metals are mechanically stronger than copper, and therefore can withstand the stresses that can occur during thermal cycling. Copper may be used for the first conductor 13 and for the second portion 21 of the second conductor, i.e. for the line conductor. The material used for the liner 18 surrounding the bottom and sidewalls of the first portion 19 is preferably titanium nitride, tantalum, tantalum nitride or tungsten. The liners 12 and 20 may be formed of tantalum and/or tantalum nitride.

The dielectric layers 10 and 14 may be formed of any suitable dielectric material, although low-k dielectric materials are preferred. Suitable dielectric materials include carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). For this embodiment, preferred dielectric materials are organic polymeric thermoset materials, consisting essentially of carbon, oxygen and hydrogen. Preferred dielectric materials include the low-k polyarylene ether polymeric material known as SiLK™ (available from The Dow Chemical Company), and the low-k polymeric material known as FLARE™ (available from Honeywell). Hardmask layers 11 and 16 may be formed of silicon carbide, silicon nitride and/or silicon dioxide.

The second portion 21 of the second conductor, i.e. the line conductor, preferably has a total thickness of about 100 to 5000 nm, more preferably about 300 nm. The first portion 19 of the second conductor, i.e. the via, preferably has a height of about 100 to 5000 nm, more preferably about 300 nm. The via liner 18 preferably has a thickness of about 2 to 50 nm, more preferably about 20 nm, and the trench liner 20 preferably has a thickness of about 2 to 50 nm, more preferably about 10 nm.

Figure 2:
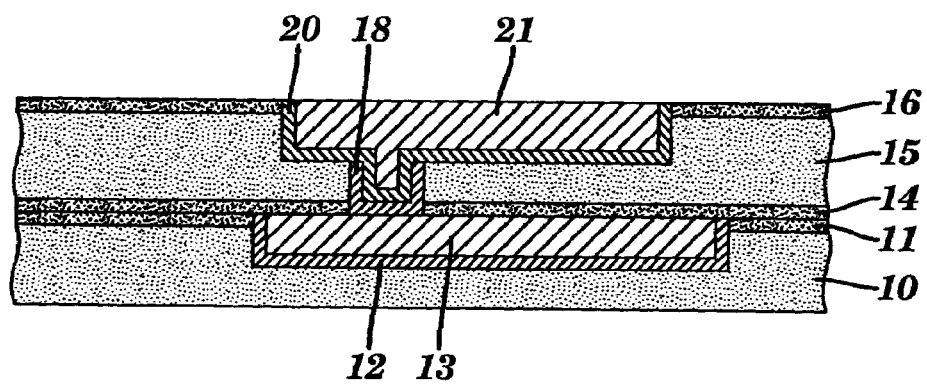
FIG. 2 illustrates an interconnect structure according to a second embodiment of the invention, in which the via is surrounded by a liner having a thickness greater than the liner surrounding the line conductor.

A second embodiment of the invention is shown in FIG. 2, and differs from the embodiment shown in FIG. 1 in that the second conductor is formed entirely of the same material, preferably copper. In other words, the via or stud is not formed of a refractory metal. However, the via or stud is surrounded on the bottom and sidewalls with a liner which is thicker than the liner surrounding the line conductor. Specifically, the via or stud is surrounded by a liner comprising first liner 18 and second liner 20, while the line conductor is surrounded only by second liner 20. First liner 18 may be formed of the same material as second liner 20, or the first liner 18 may be formed of a material different from the second liner 20.

For the embodiment shown in FIG. 2, the same materials may be used for each of the features discussed with regard to the embodiment shown in FIG. 1. The second portion 21 of the second conductor, i.e. the line conductor, preferably has a total thickness of about 100 to 5000 nm, more preferably about 300 nm. The first portion 19 of the second conductor, i.e. the via, preferably has a height of about 100 to 5000 nm, more preferably about 300 nm. The liners 18 and 20 in the via preferably have a combined thickness of about 2 to 50 nm, more preferably about 30 nm, and the trench liner 20 preferably has a thickness of about 2 to 50 nm, more preferably about 10 nm.

Figure 3:
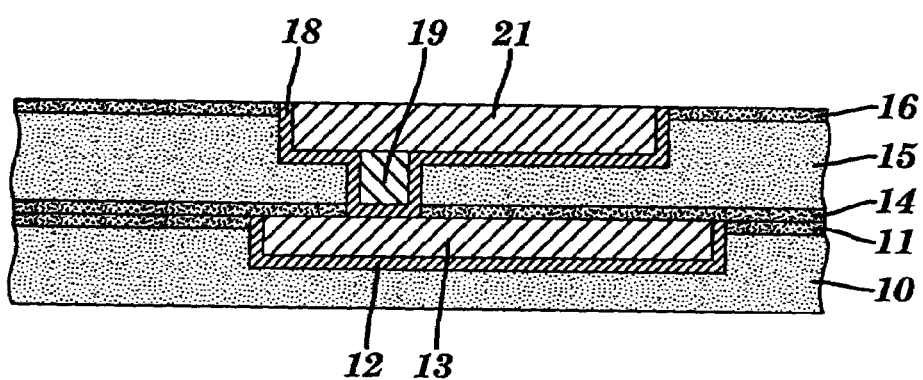
FIG. 3 illustrates an interconnect structure according to a third embodiment of the invention, in which the via is formed of a material different from that of the line conductor, and the via and line conductors are surrounded on the bottom and sidewalls by a liner, but the liner does not separate the via from the line conductor.

A third embodiment of the invention is shown in FIG. 3, and differs from the embodiment shown in FIG. 1 in that first portion 19 and second portion 21 of the second conductor are both surrounded by liner 18. In other words, first portion 19 and second portion 21 do not have separate liners, as in the embodiment shown in FIG. 1. Rather, a single liner 18 surrounds the bottom and sidewalls of both first portion 19 and second portion 21.

For the embodiment shown in FIG. 3, the same materials may be used for each of the features discussed with regard to the embodiment shown in FIG. 1. The second portion 21 of the second conductor, i.e. the line conductor, preferably has a total thickness of about 100 to 5000 nm, more preferably about 300 nm. The first portion 19 of the second conductor, i.e. the via, preferably has a height of about 100 to 5000 nm, more preferably about 300 nm. The liner 18 in the via and trench preferably has a thickness of about 2 to 50 nm, more preferably about 20 nm.

The embodiment shown in FIG. 1 may be formed using the method illustrated in FIGS. 4(a)-4(f). The starting point for the method is a substrate comprising a first dielectric layer 10 having at least one first conductor 13 embedded therein. First conductor 13 has a top surface which is coplanar with a top surface of dielectric layer 10. As discussed previously, a hardmask layer 11 optionally may be deposited on dielectric layer 10, in which case the conductor 13 has a top surface coplanar with the top surface of hardmask layer 11. Optionally, a conductive liner 12 is disposed between conductor 13 and dielectric layer 10.

Figure 4A:
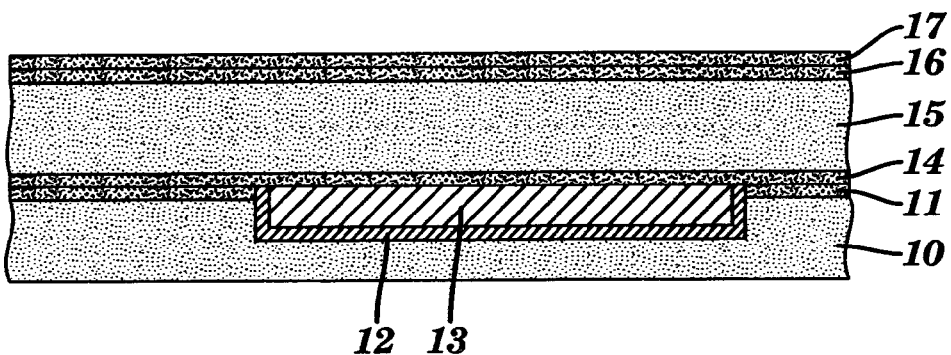
FIGS. 4(a)-4(f) illustrate a method for forming the interconnect structure shown in FIG. 1.
Figure 4B:
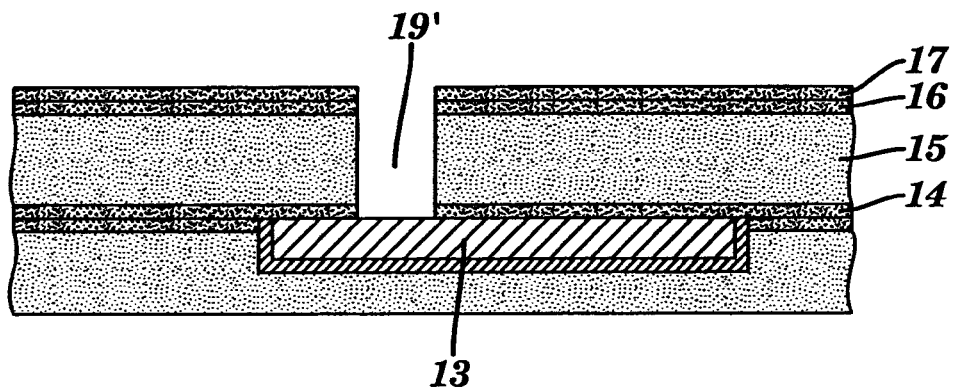

The method begins with deposition of second dielectric layer 15 and, optionally, hardmask layers 16 and 17, as shown in FIG. 4(a). Hardmask layers 16 and 17 may be formed of silicon carbide (SiC), silicon nitride (SiN), and/or silicon dioxide ($SiO_2$). At least one first opening 19' is formed in dielectric layer 15 and hardmask layers 16 and 17, thereby exposing first conductor 13, as shown in FIG. 4(b). Opening 19' may be formed by any suitable technique, including conventional lithography and reactive ion etching (RIE).

Figure 4C:
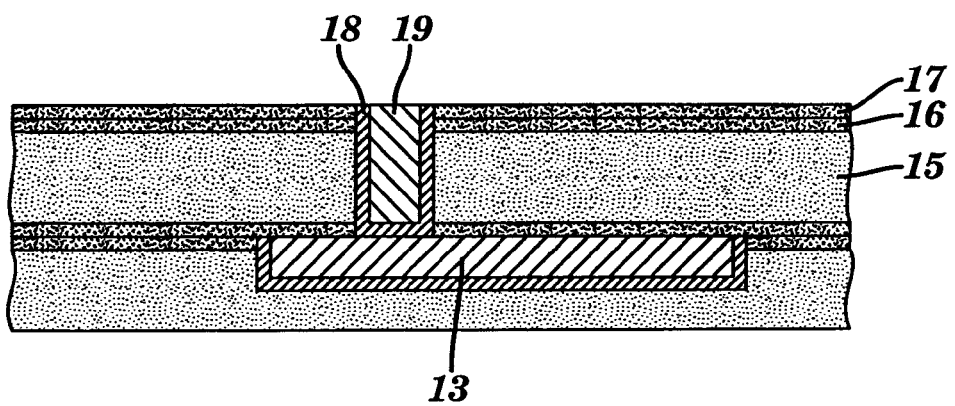

Opening 19' is then filled with a first conductive material 19, as shown in FIG. 4(c). Optionally, prior to filling opening 19' with conductive material 19, a conductive liner 18 may be deposited on the bottom and sidewalls of opening 19'. Conductive material 19 is preferably a refractory metal such as tungsten, and may be deposited by chemical vapor deposition (CVD). When the conductive material is tungsten, then tungsten hexacarbonyl precursor is preferred over $WF_6$, to minimize the risk of fluorine attacking the low-k dielectric material 15.

The refractory metal 19 may be deposited by any suitable technique, including chemical vapor deposition (CVD) or by ionized-metal physical vapor deposition (I-PVD). For W or TiN deposition, the preferred method is CVD. For Ta or TaN deposition, the preferred method is I-PVD.

The I-PVD process uses alternate cycles of deposition and partial etchback to fill the via with metal. Using the I-PVD process, small features such as vias can be almost entirely filled with Ta (or TaN), while at the same time leaving a thin layer (about 5 to 25 nm) of Ta in the bottom of the trench. This is possible because the ratio of deposition to etchback increases as feature size shrinks.

For example, to fill vias having a diameter of about 0.2 micron and a height of about 0.4 micron in a dual damascene structure, a Ta deposition plus etchback could be used. First, a Ta layer of about 5 to 30 nm is deposited at a magnetron power of about 2 to 60 killowatts, pressure of about 1 to 10 millitorr, and wafer bias of zero to about 200 watts. Next, an etchback process is run (preferably in the same chamber) with a magnetron power of about 2 to 30 killowatts, pressure of about 1 to 10 millitorr, and wafer bias of about 200 to 1200 watts. In the etchback step, metal is sputtered from the bottom of the via onto the sidewalls and thus thickens the sidewalls. Additional deposition and etchback cycles can be used to further increase the thickness of metal on the sidewalls of the via, until the via is completely (or nearly completely) filled with metal.

Liner 18 is preferably formed of titanium nitride, tantalum, tantalum nitride or tungsten, and may be deposited by physical vapor deposition (PVD) or by CVD. Following deposition of liner material 18 and conductive material 19, excess material is preferably removed by CMP or sputter etchback to make the top surface of conductive material 19 coplanar with the top surface of dielectric material 15.

Figure 4D:
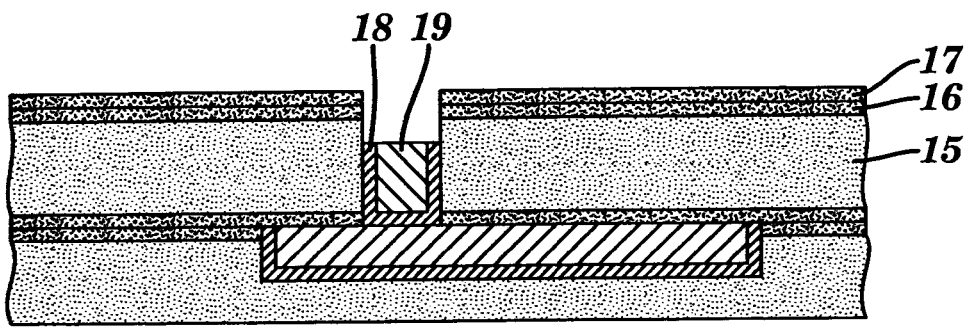

Next, a top portion of first conductive material 19 and liner 18 is removed, as shown in FIG. 4(d). The tungsten 19 and liner 18 may be etched back, for example, by dry etch using fluorine-based chemistry, wet etch using hydrogen peroxide ($H_2O_2$), or electroetching.

Figure 4E:
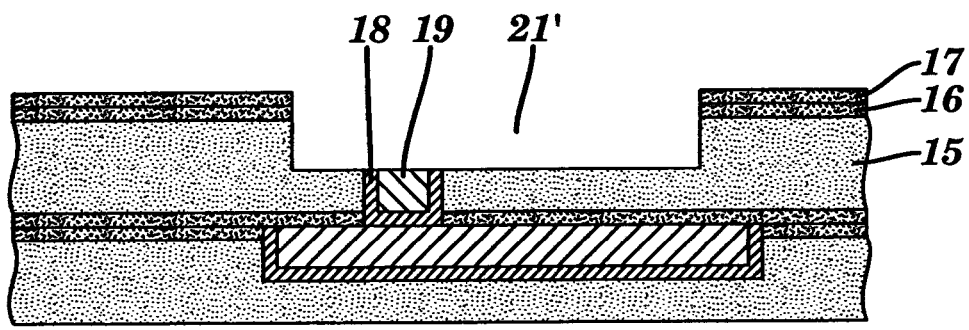

Following etchback of conductive material 19 and liner 18, at least one second opening 21' is formed in dielectric material 15 and hardmask layers 16 and 17, as shown in FIG. 4(e). Second opening 21' overlies first conductive material 19, and has a lateral extent greater than that of first opening 19'. Second opening 21' may be formed by any suitable technique, including conventional lithography and RIE.

Figure 4F:
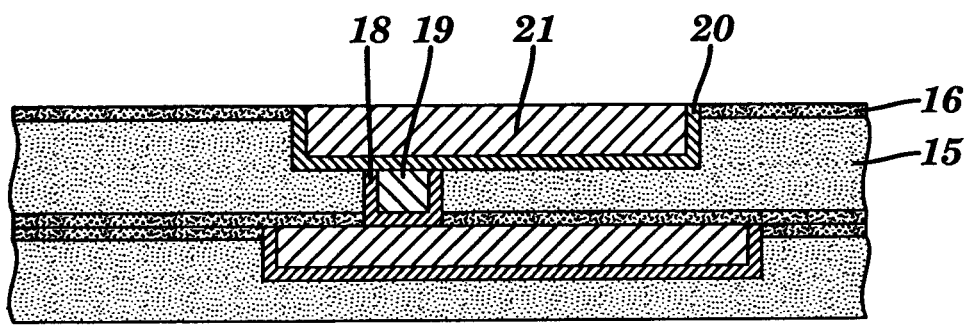

Finally, opening 21' is filled with a second conductive material 21, as shown as FIG. 4(f). Optionally, prior to filling opening 21' with conductive material 21, a second conductive liner 20 may be deposited on the bottom and sidewalls of opening 21'. Conductive material 21 is preferably copper, and may be deposited by copper plating, which typically involves copper seed deposition by PVD, copper plating, and then CMP.

The embodiment shown in FIG. 1 may alternatively be formed using the method illustrated in FIGS. 6(a)-6(f). This method differs from the method shown in FIGS. 4(a)-4(f) in that the via and trench openings 19' and 21' are both formed prior to filling with first conductive material 19. The starting point for the method is again a substrate comprising a first dielectric layer 10 having at least one first conductor 13 embedded therein. First conductor 13 has a top surface which is coplanar with a top surface of dielectric layer 10. As discussed previously, a hardmask layer 11 optionally may be deposited on dielectric layer 10, in which case the conductor 13 has a top surface coplanar with the top surface of hardmask layer 11. Optionally, a conductive liner 12 is disposed between conductor 13 and dielectric layer 10.

Figure 6A:
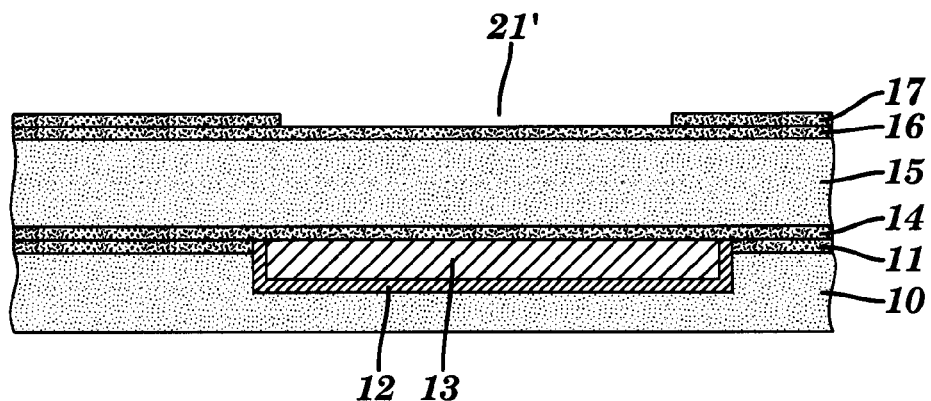
FIGS. 6(a)-6(f) illustrate a method for forming the interconnect structure shown in FIG. 1.
Figure 6B:
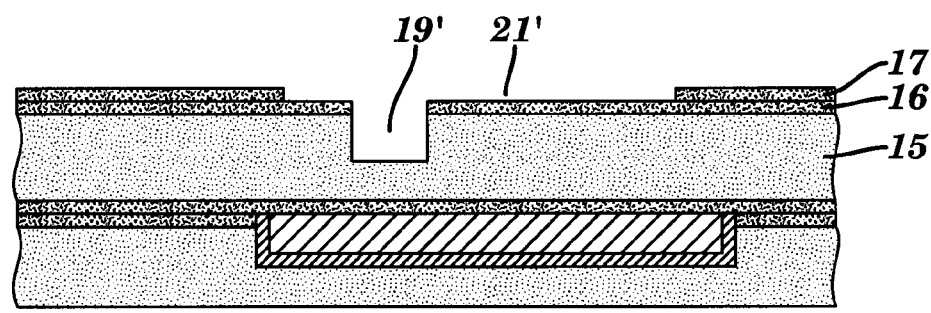

The method begins with deposition of second dielectric layer 15 and hardmask layers 16 and 17, as shown in FIG. 6(a). At least one first opening 21' is formed in hardmask layer 17. Then, at least one second opening 19' is formed in hardmask layer 16 and partially into dielectric layer 15, as shown in FIG. 6(b). Opening 19' is formed beneath opening 21', and has a lateral extent less than that of opening 21'. Openings 19' and 21' may be formed by any suitable technique, including conventional lithography and RIE.

Figure 6C:
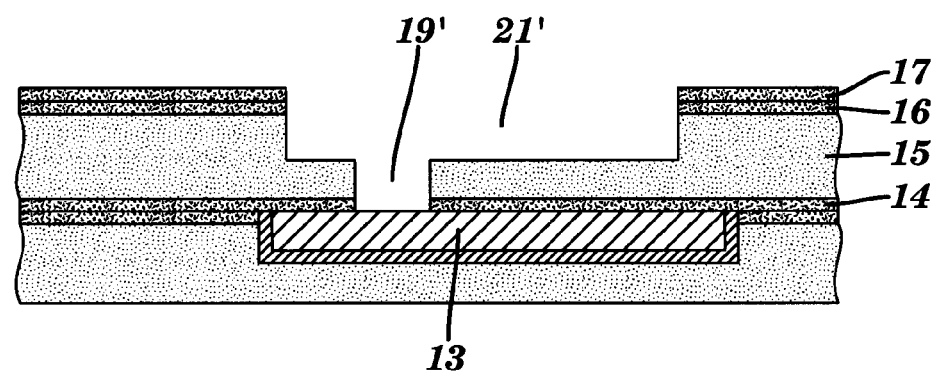

Next, openings 19' and 21' are extended into dielectric layer 15, as shown in FIG. 6(c). The trench 21' and via 19' may be formed using, for example, RIE. Opening 21' extends partially into dielectric layer 15, and opening 19' extends fully through dielectric layer 15, thereby exposing conductor 13.

Figure 6D:
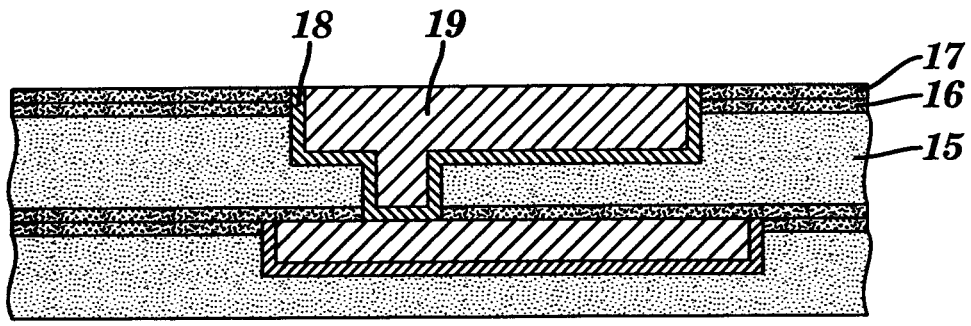

Openings 19' and 21' are then filled with a first conductive material 19, as shown in FIG. 6(d). Optionally, prior to filling these openings with conductive material 19, a conductive liner 18 may be deposited on the bottom and sidewalls of the openings. Conductive material 19 is preferably a refractory metal such as tungsten, and may be deposited by CVD. When the conductive material is tungsten, then tungsten hexacarbonyl precursor is preferred over $WF_6$, to minimize the risk of fluorine attacking the low-k dielectric material 15. Liner 18 is preferably formed of titanium nitride, tantalum, tantalum nitride or tungsten, and may be deposited by PVD or by CVD. Following deposition of liner material 18 and conductive material 19, excess material is preferably removed by CMP or sputter etchback to make the top surface of conductive material 19 coplanar with the top surface of dielectric material 15.

Figure 6E:
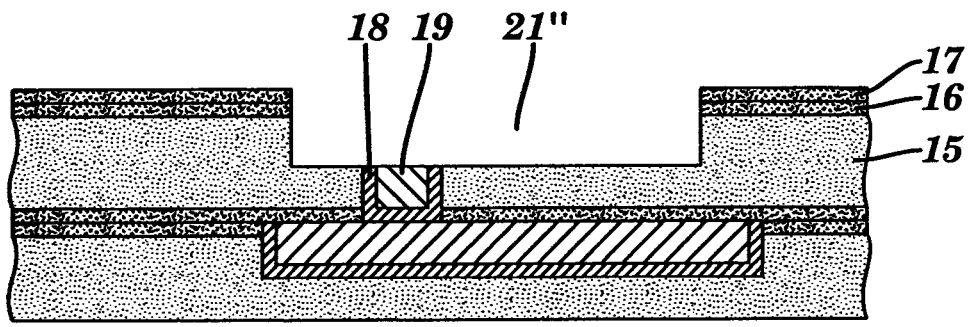

Next, a top portion of first conductive material 19 and liner 18 is removed, as shown in FIG. 6(e), thereby forming opening 21". The tungsten 19 and liner 18 may be etched back, for example, by dry etch using fluorine-based chemistry, wet etch using $H_2O_2$, or electroetching.

Figure 6F:
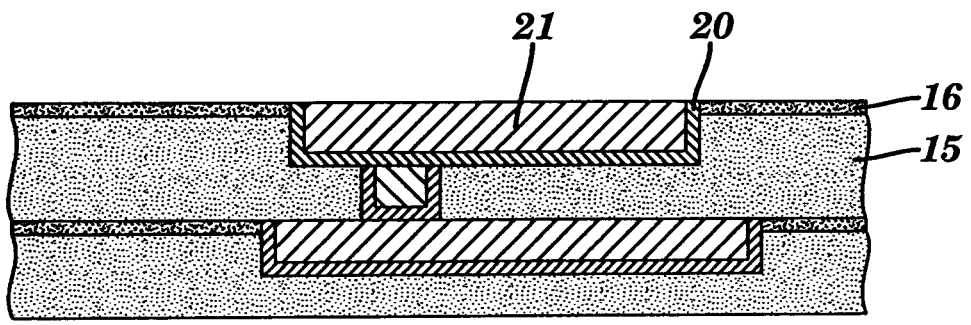

Finally, opening 21" is filled with a second conductive material 21, as shown in FIG. 6(f). Optionally, prior to filling opening 21" with conductive material 21, a second conductive liner 20 may be deposited on the bottom and sidewalls of opening 21". Conductive material 21 is preferably copper, and may be deposited by copper plating.

The embodiment shown in FIG. 2 may be formed using the method illustrated in FIGS. 5(a)-5(f). Again, the starting point for the method is a substrate comprising a first dielectric layer 10 having at least one first conductor 13 embedded therein. First conductor 13 has a top surface which is coplanar with a top surface of dielectric layer 10. As discussed previously, a hardmask layer 11 optionally may be deposited on dielectric layer 10, in which case the conductor 13 has a top surface coplanar with the top surface of hardmask layer 11. Optionally, a conductive liner 12 is disposed between conductor 13 and dielectric layer 10.

Figure 5A:
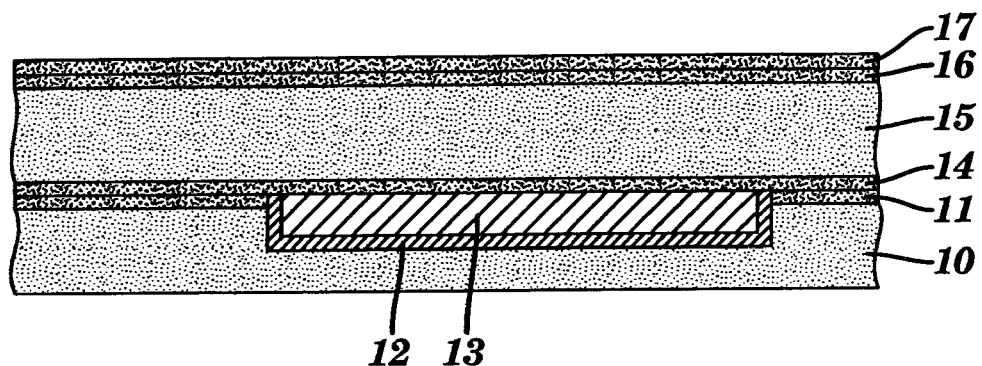
FIGS. 5(a)-5(f) illustrate a method for forming the interconnect structure shown in FIG. 2.
Figure 5B:
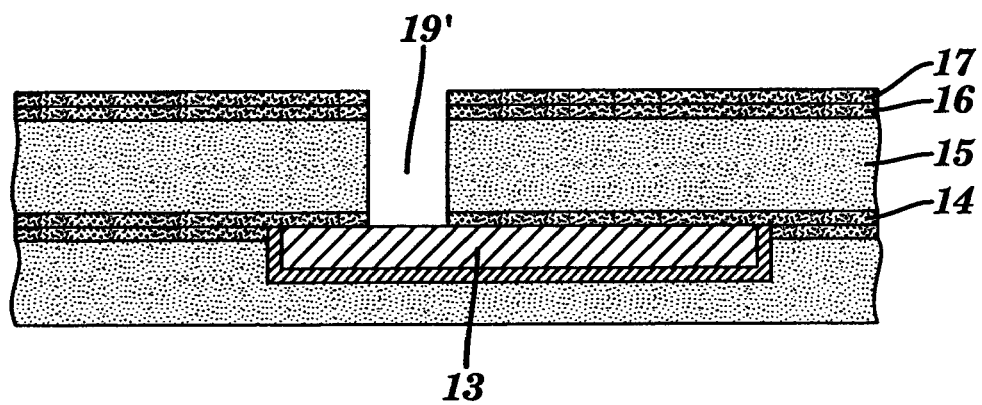

The method begins with deposition of second dielectric layer 15 and, optionally, hardmask layers 16 and 17, as shown in FIG. 5(a). At least one first opening 19' is formed in dielectric layer 15 and hardmask layers 16 and 17, thereby exposing first conductor 13, as shown in FIG. 5(b). Opening 19' may be formed by any suitable technique, including conventional lithography and reactive ion etching (RIE).

Figure 5C:
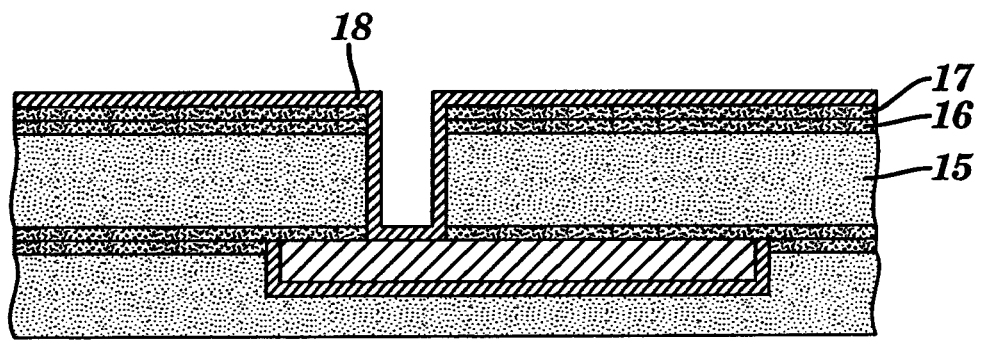

A liner 18 is then deposited on the bottom and sidewalls of opening 19', as shown in FIG. 5(c). Liner 18 may also be deposited on hardmask layer 17. Liner 18 is preferably formed of titanium nitride, tantalum, tantalum nitride or tungsten, and preferably has a thickness of about 5 to 100 nm.

Figure 5D:
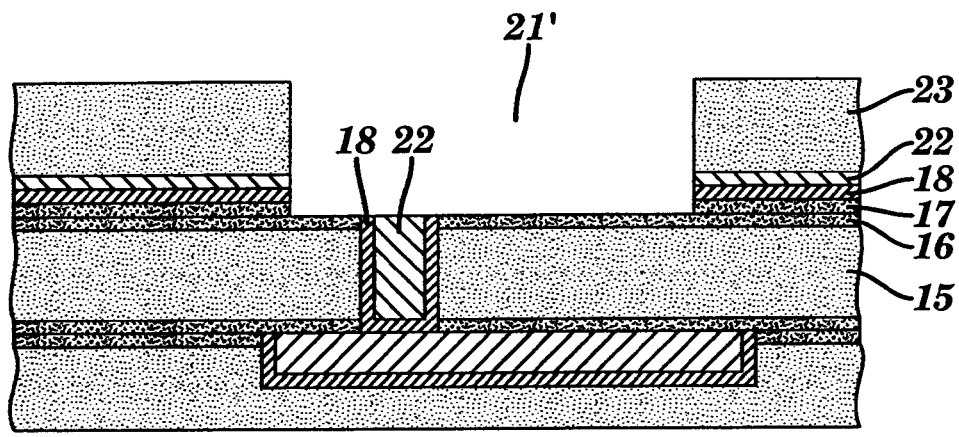

Next, opening 19' is filled with a sacrificial material 22, such as anti-reflective coating (ARC), as shown in FIG. 5(d). For example, a layer of ARC 22 may be deposited on liner 18 and in opening 19', then a layer of photoresist 23 may be deposited on ARC 22. Opening 21' is then formed in photoresist 23 and ARC 22, and this opening is transferred to liner 18 and hardmask layer 17.

Figure 5E:
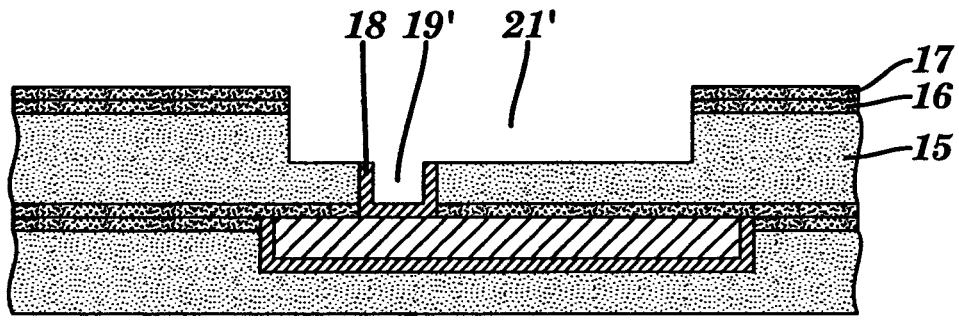

In FIG. 5(e), photoresist 23 and ARC 22 are then stripped from the surface of the substrate, and ARC 22 is removed from opening 19'. The refractory metal liner 18 protects the low-k dielectric material 15 during resist strip. Liner 18 is then etched back from the surface of the substrate, and opening 21' is transferred to hardmask layer 16 and dielectric layer 15.

Figure 5F:
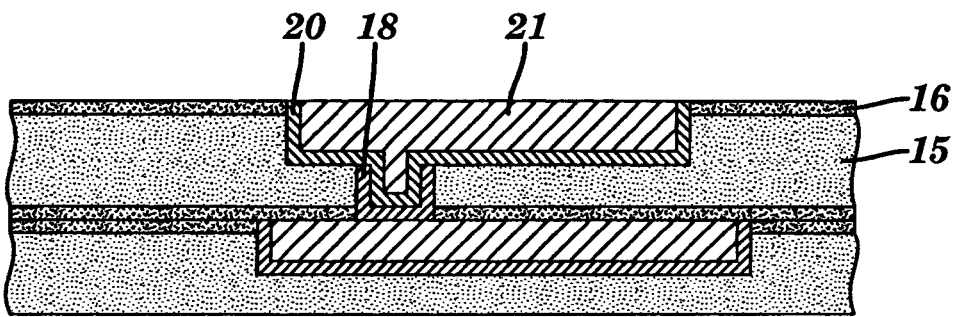

Finally, a second liner 20 is deposited on the bottom and sidewalls of openings 19' and 21', and then these openings are filled with conductive material 21, as shown in FIG. 5(f). Following deposition of liner material 20 and conductive material 21, the top surface of conductor 21 is made coplanar with the top surface of dielectric layer 15 or hardmask layer 16 using, for example, CMP. Note that the via or stud portion of the second conductor is surrounded on the bottom and sidewalls by a liner which is thicker than the liner surrounding the line conductor. In other words, the via or stud portion is surrounded by a dual thickness liner comprising first liner 18 and second liner 20, while the line conductor is surrounded only by second liner 20.

Figure 7A:
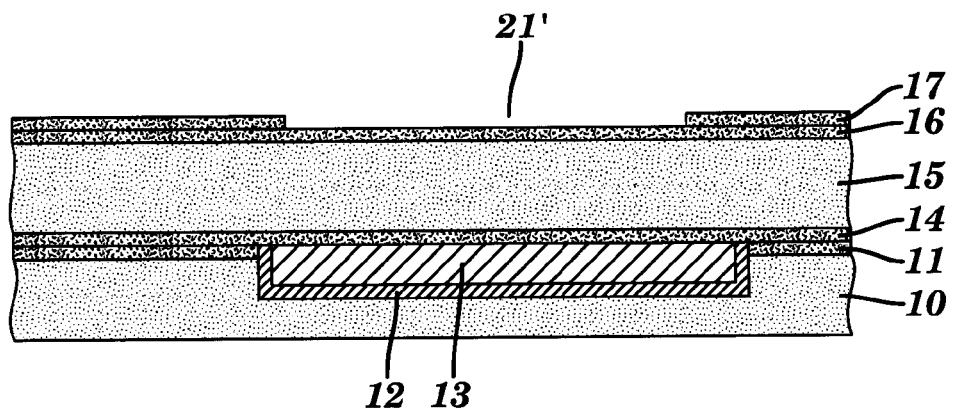
FIGS. 7(a)-7(f) illustrate a method for forming the interconnect structure shown in FIG. 3.
Figure 7B:
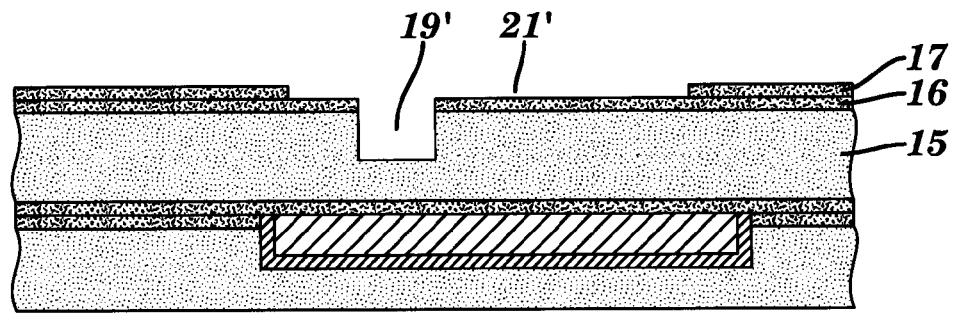
Figure 7C:
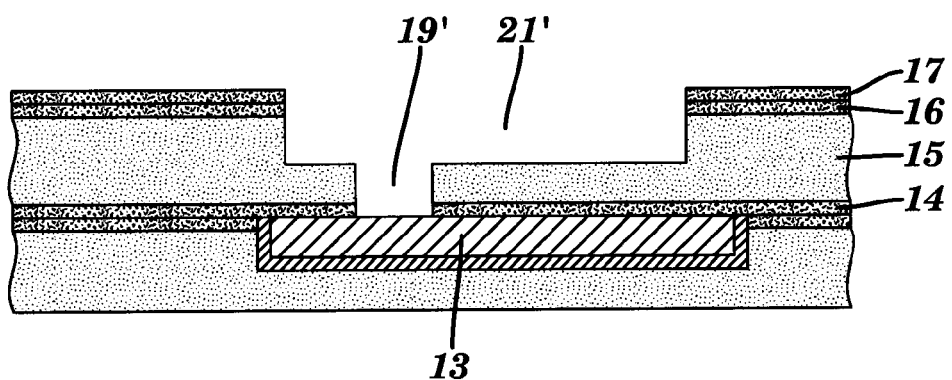
Figure 7D:
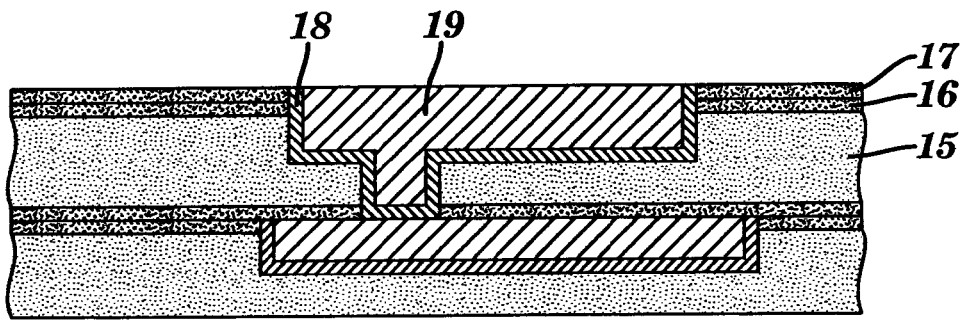
Figure 7E:
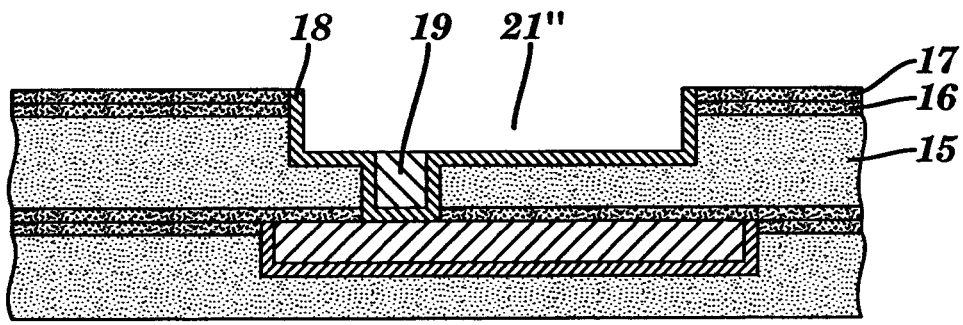

The embodiment shown in FIG. 3 may be formed using the method illustrated in FIGS. 7(a)-7(f). This method differs from the method shown in FIGS. 6(a)-6(f) in that the liner 18 is not removed during the step of removing a top portion of first conductive material 19, as shown in FIG. 7(e). Again, the starting point for this method is a substrate comprising a first dielectric layer 10 having at least one first conductor 13 embedded therein. First conductor 13 has a top surface which is coplanar with a top surface of dielectric layer 10. As discussed previously, a hardmask layer 11 optionally may be deposited on dielectric layer 10, in which case the conductor 13 has a top surface coplanar with the top surface of hardmask layer 11. Optionally, a conductive liner 12 is disposed between conductor 13 and dielectric layer 10.

The method begins with deposition of second dielectric layer 15 and, optionally, hardmask layers 16 and 17, as shown in FIG. 7(a). At least one first opening 21' is formed in hardmask layer 17. Then, at least one second opening 19' is formed in hardmask layer 16 and partially into dielectric layer 15, as shown in FIG. 7(b). Opening 19' is formed beneath opening 21', and has a lateral extent less than that of opening 21'. Openings 19' and 21' may be formed by any suitable technique, including conventional lithography and RIE.

Next, openings 19' and 21' are extended into dielectric layer 15, as shown in FIG. 7(c). The trench 21' and via 19' may be formed using, for example, RIE. Opening 21' extends partially into dielectric layer 15, and opening 19' extends fully through dielectric layer 15, thereby exposing conductor 13.

Openings 19' and 21' are then filled with a first conductive material 19, as shown in FIG. 7(d). Optionally, prior to filling these openings with conductive material 19, a conductive liner 18 may be deposited on the bottom and sidewalls of the openings. Conductive material 19 is preferably a refractory metal such as tungsten, and may be deposited by CVD. When the conductive material is tungsten, then tungsten hexacarbonyl precursor is preferred over $WF_6$, to minimize the risk of fluorine attacking the low-k dielectric material 15. Liner 18 is preferably formed of titanium nitride, tantalum, tantalum nitride or tungsten, and may be deposited by PVD or by CVD. Following deposition of liner material 18 and conductor material 19, excess material is preferably removed by CMP or sputter etchback to make the top surface of conductive material 19 coplanar with the top surface of dielectric material 15.

Next, a top portion of first conductive material 19 is removed, but the liner 18 is not removed, as shown in FIG. 6(e), thereby forming opening 21". The tungsten 19 may be etched back, for example, by dry etch using fluorine-based chemistry, wet etch using $H_2O_2$, or electroetching. The refractory metal liner 18 protects the low-k dielectric material 15 during tungsten etchback.

Figure 7F:
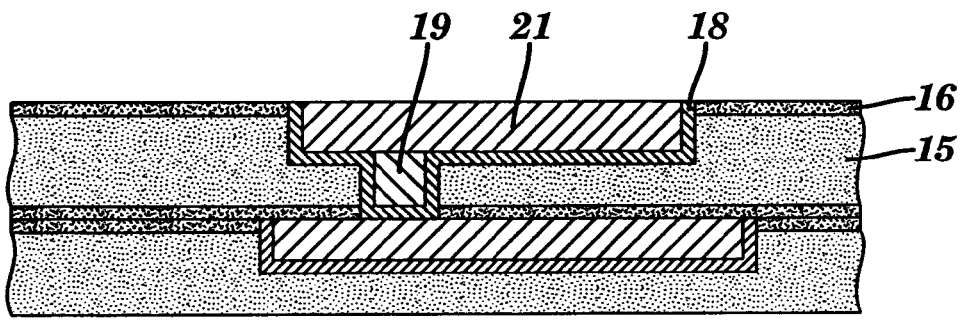

Finally, opening 21" is filled with a second conductive material 21, as shown in FIG. 7(f). With this embodiment, a second conductive liner need not be deposited on the bottom and sidewalls of opening 21" prior to depositing conductive material 21. However, a second conductive liner (not shown) may be deposited over liner 18 and conductive material 19, prior to depositing conductive material 21. The second conductive liner would preferably be formed of tantalum nitride and/or tantalum, and would have a thickness of about 1 to 10 nm. A sputter clean may be used to remove contaminants from the surface of first liner 18 prior to depositing the second liner. Conductive material 21 is preferably copper, and may be deposited by copper plating.

Note that there are two basic embodiments of the method of this invention. The first embodiment is shown in two variations in FIGS. 4(a)-4(f) and 5(a)-5(f). In this first embodiment, the via opening is formed first, and the via is filled with a first conductive material such as a refractory metal, prior to forming the trench opening. The second embodiment is shown in two variations in FIGS. 6(a)-6(f) and 7(a)-7(f). In this second embodiment, both the via and trench openings are formed first, and these openings are then filled with the first conductive material such as a refractory metal. The two variations shown for this second embodiment comprise forming the via opening first and then forming the trench opening, but the second embodiment could also be practiced by forming the trench opening first and then forming the via opening.

In this invention, it is preferred to use a thick refractory metal in the via for improved mechanical strength while using only a thin refractory metal in the trenches to provide low resistance. This is achieved in FIGS. 1 and 3, for example, by using a refractory metal for first conductive material 19. In FIG. 2, this is achieved by using a refractory metal for both liners 18 and 20, thereby forming a thick refractory metal liner for the via or stud and a thin refractory metal liner for the line conductor. The refractory metal liner also protects the low-k dielectric material 15 during photoresist strip, as in FIG. 5(e), and during tungsten etchback, as in FIG. 7(e).

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A method for forming an interconnect structure on a substrate, the substrate comprising a first layer of a first dielectric material having at least one first conductor embedded therein, the first conductor having a top surface coplanar with a top surface of the first layer of the first dielectric material, the method comprising the steps of:

depositing a second layer of a second dielectric material on the first layer of the first dielectric material;

forming at least one first opening in the second layer of the second dielectric material;

forming at least one second opening in the second layer of the second dielectric material, the second opening overlying the first opening, and the second opening having a lateral extent greater than that of the first opening;

depositing a first conductive liner on bottoms and sidewalls of said first and second openings followed first by filling at least the first opening and the second opening with a first conductive material and second by removing the first conductive material and the first conductive liner from the bottoms and the sidewalls of the second opening; and filling the second opening with a second conductive material, thereby forming a second conductor, wherein the second conductor has a top surface being made coplanar with the top surface of the second layer of the second dielectric material.

2. The method of claim 1, wherein the first opening partially exposes the first conductor.

3. The method of claim 2, further comprising depositing a second conductive liner on the bottom and sidewalls of the second opening before said filling the second opening, wherein the second conductive material is different from the first conductive material.

4. A method for forming an interconnect structure on a substrate, the substrate comprising a first layer of a first dielectric material having at least one first conductor embedded therein, the first conductor having a top surface coplanar with a top surface of the first layer of the first dielectric material, the method comprising the steps of:

depositing a second layer of a second dielectric material on the first layer of the first dielectric material;

forming at least one first opening in the second layer of the second dielectric material, the first opening extending partially through the second layer of the second dielectric material but not exposing the first conductor;

forming at least one second opening in the second layer of the second dielectric material and extending the first opening through the remainder of the second dielectric material, thereby exposing the first conductor, the second opening overlying the first opening and the second opening having a lateral extent greater than that of the first opening;

depositing a first conductive liner on the bottom and sidewalls of the first and second openings;

filling the first and second openings with a first conductive material;

removing the first conductive material and the first conductive liner from the bottom and the sidewalls of the second opening;

depositing a second conductive liner on the bottom and sidewalls of the second opening; and filling the second opening with a second conductive material, wherein the second conductive material is different from the first conductive material, and the second conductive material has a top surface which is made coplanar with the top surface of the second layer of dielectric material.

5. The method of claim 4, wherein the second dielectric material is different from the first dielectric material.

6. The method of claim 4, wherein the second conductive material is copper and the first conductive material is tungsten.

7. The method of claim 4, wherein the first conductive liner is formed of material selected form the group consisting of titanium nitride, tantalum, tantalum nitride and tungsten, and the second conductive liner is formed of a material selected form the group consisting of tantalum nitride and tantalum.

8. The method of claim 4, wherein the second conductive liner has a thickness less than a thickness of the first conductive liner.

9. The method of claim 4, wherein the first and second openings are formed using lithography and reactive ion etching.

10. The method of claim 4, wherein the first opening is filled with the first conductive material by chemical vapor deposition.

11. The method of claim 4, wherein the first conductive liner and the second conductive liner are deposited by physical vapor deposition or chemical vapor deposition.

12. The method of claim 4, wherein the top surface of the second conductive material is made coplanar by chemical mechanical polishing.

13. The method of claim 4, wherein the top portion of first conductive material is removed by dry etching using fluorine-based chemistry, wet etching using hydrogen peroxide, or electroetching.

* * * * *